United States Patent
Lin

(10) Patent No.: US 9,203,000 B2
(45) Date of Patent: Dec. 1, 2015

(54) LIGHT-EMITTING DEVICE PACKAGE AND METHOD FOR MANUFACTURING THE SAME

(71) Applicant: LEXTAR ELECTRONICS CORPORATION, Hsinchu (TW)

(72) Inventor: Su-Hon Lin, Keelung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/207,394

(22) Filed: Mar. 12, 2014

(65) Prior Publication Data
US 2015/0076530 A1    Mar. 19, 2015

(30) Foreign Application Priority Data
Sep. 16, 2013   (TW) .............................. 102133446 A

(51) Int. Cl.
| H01L 33/58 | (2010.01) |
| H01L 33/00 | (2010.01) |
| H01L 33/48 | (2010.01) |
| H01L 33/44 | (2010.01) |
| H01L 33/62 | (2010.01) |

(52) U.S. Cl.
CPC ............... *H01L 33/58* (2013.01); *H01L 33/005* (2013.01); *H01L 33/0095* (2013.01); *H01L 33/44* (2013.01); *H01L 33/486* (2013.01); *H01L 2933/0025* (2013.01); *H01L 2933/0033* (2013.01)

(58) Field of Classification Search
CPC .............................................. H01L 2933/0033
See application file for complete search history.

(56) References Cited

U.S. PATENT DOCUMENTS

| 2008/0023713 A1* | 1/2008 | Maeda et al. .................... 257/98 |
| 2009/0108282 A1* | 4/2009 | Matsuda et al. ................. 257/98 |
| 2012/0235193 A1* | 9/2012 | Hu et al. .......................... 257/98 |
| 2013/0015490 A1* | 1/2013 | Lin et al. .......................... 257/99 |
| 2015/0102374 A1* | 4/2015 | Schmidtke et al. ............. 257/98 |

* cited by examiner

*Primary Examiner* — Stephen W Smoot

(57) ABSTRACT

A light-emitting device package is disclosed. The light-emitting device package includes a metal substrate. An insulating layer is on the metal substrate, wherein the insulating layer has at least one opening to expose the metal substrate. At least one light-emitting device is disposed in the at least one opening of the insulating layer. A sidewall of the at least one opening of the insulating layer is covered by an optical spacer. The disclosure also provides a method for manufacturing the light-emitting device package.

12 Claims, 2 Drawing Sheets

LIGHT-EMITTING DEVICE PACKAGE AND METHOD FOR MANUFACTURING THE SAME

CROSS REFERENCE TO RELATED APPLICATIONS

This application claims the priority of Taiwan Patent Application No. 102133446 filed on Sep. 16, 2013, and the entirety of which is incorporated by reference herein.

BACKGROUND OF THE INVENTION

1. Field of the Invention

The present invention relates to a manufacturing technique of a light-emitting device, and in particular to a light-emitting device package and a method for manufacturing the same.

2. Description of the Related Art

Various light-emitting devices have advanced with the development and advances in technologies to satisfy customers in the modern world. Among the various light-emitting devices, there has been a trend for light-emitting diodes (LEDs) to gradually replace traditional illuminated devices (for example, fluorescent lamps and incandescent lights) due to advantages such as low heat generation, low energy consumption, long lifespans, and small volumes.

The package for LED includes a substrate, an insulating layer and a circuit layer. The insulating layer may have at least one opening such that the LEDs are disposed therein.

The sidewall of the insulating layer, however, is prone to yellowing upon being illuminated by the LEDs. The sidewall of the insulating layer suffering from yellowing may absorb light emitted from the LEDs. As a result, the brightness of the LED package is dramatically decreased.

Therefore, a novel light-emitting device package is desired to solve or mitigate the aforementioned problems.

BRIEF SUMMARY OF THE INVENTION

A detailed description is given in the following embodiments with reference to the accompanying drawings. A light-emitting device package and a method for manufacturing the same are provided.

An exemplary embodiment of a light-emitting device package includes a metal substrate. An insulating layer is on the metal substrate, wherein the insulating layer has at least one opening to expose the metal substrate. At least one light-emitting device is disposed in the at least one opening of the insulating layer. A sidewall of the at least one opening of the insulating layer is covered by an optical spacer.

An exemplary embodiment of a method for manufacturing a light-emitting device package includes providing a metal substrate. An insulating layer is formed on the metal substrate, wherein the insulating layer has at least one opening to expose the metal substrate. An optical spacer covers a sidewall of the at least one opening of the insulating layer. At least one light-emitting device is formed in the at least one opening of the insulating layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of implementing the invention. This description is made for the purpose of illustrating the general principles of the invention and should not be taken in a limiting sense. The scope of the invention is best determined by reference to the appended claims.

Figure 1A:
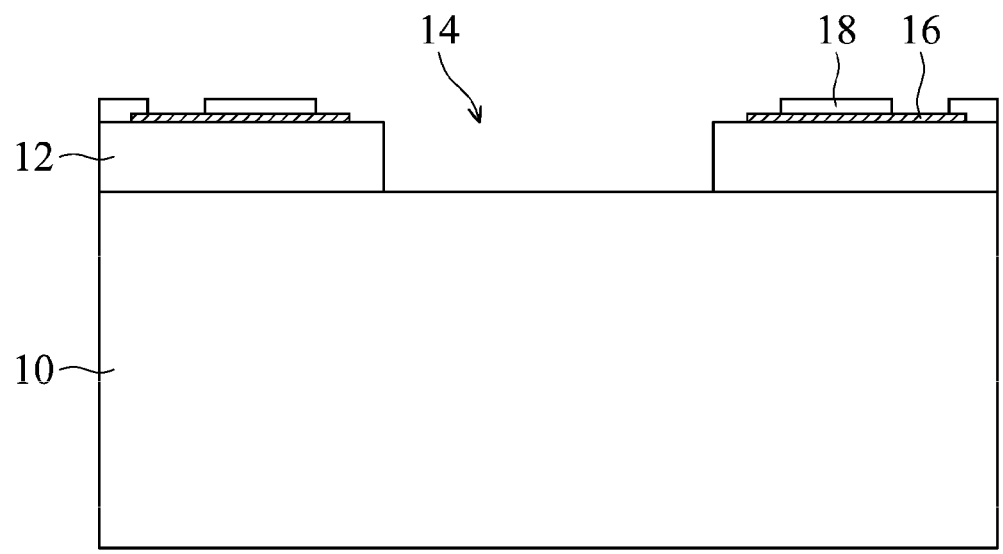
FIGS. 1A-1D are cross sectional views of a method for manufacturing a light-emitting device package according to an embodiment of the invention.
Figure 1B:
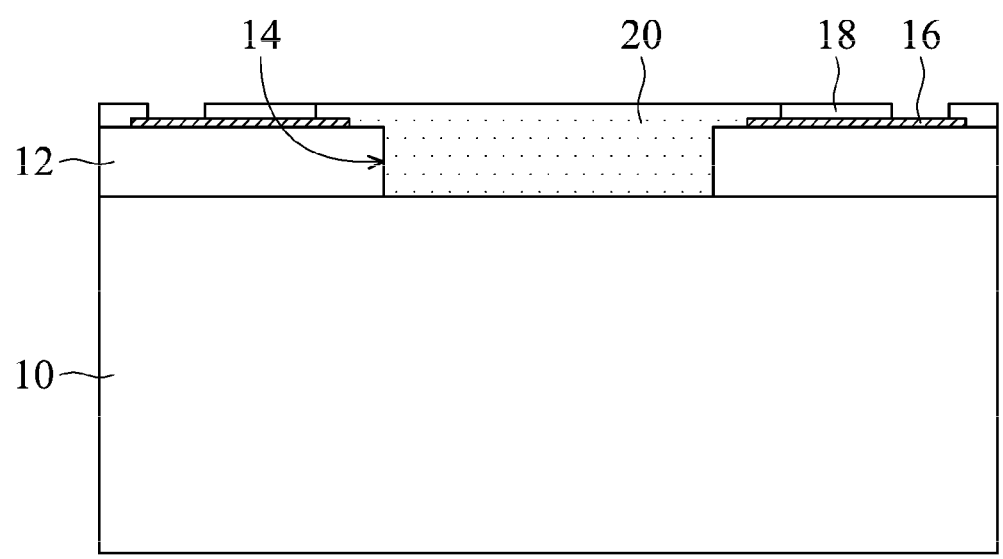
Figure 1C:
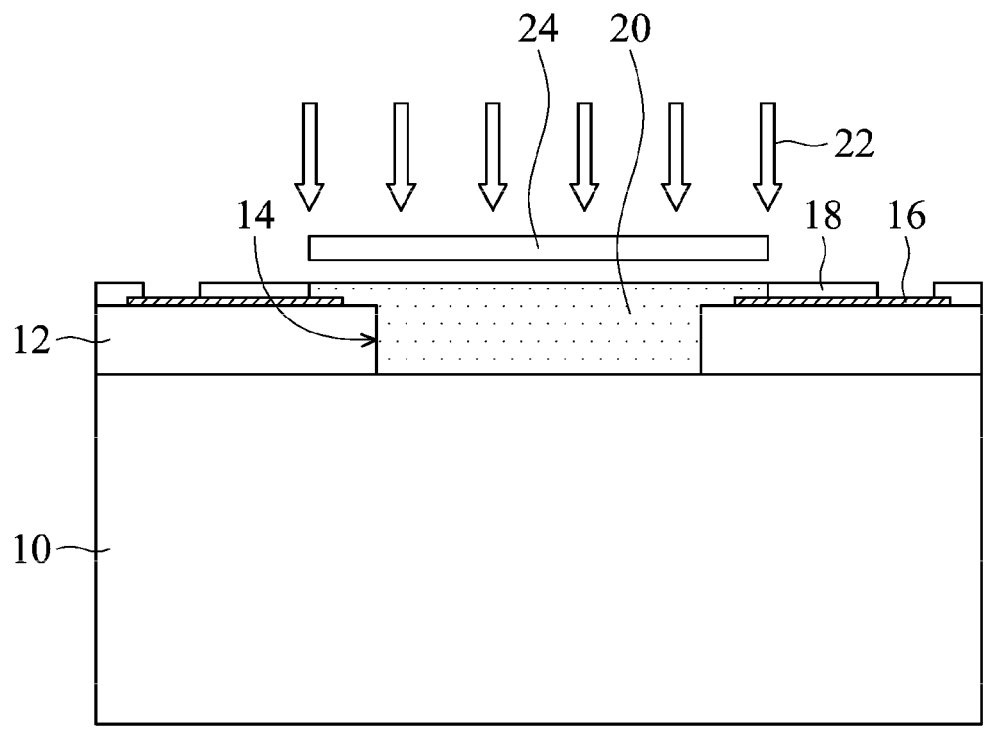
Figure 1D:
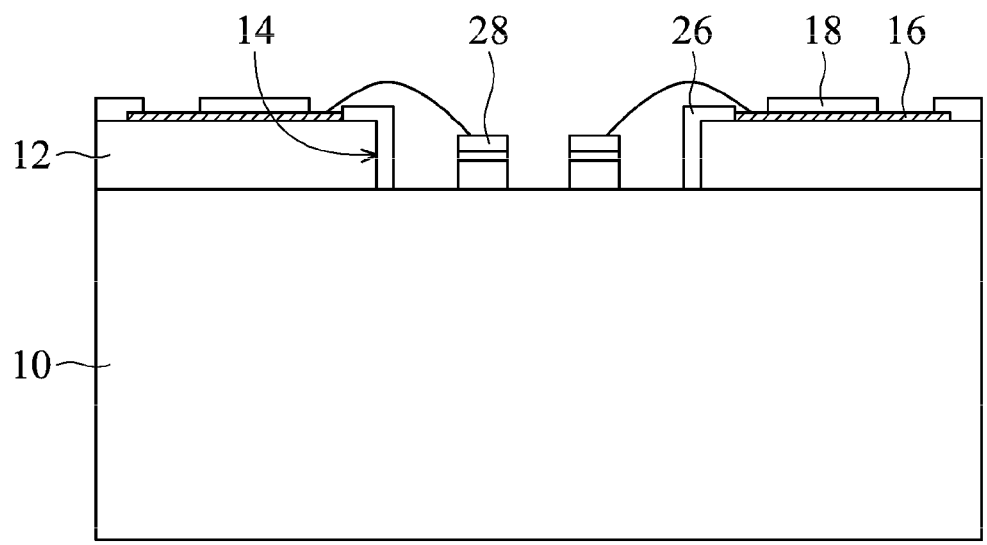

FIG. 1D is a cross sectional view of a light-emitting device package according to an embodiment of the invention. Referring to FIG. 1D, in the embodiment, the light-emitting device package includes a metal substrate 10, an insulating layer 12, at least one light-emitting device 28 and an optical spacer 26. In the embodiment, the light-emitting device package further includes a circuit layer 16 and a solder resist layer 18. The insulating layer 12 is on the metal substrate 10, the circuit layer 16 is on the insulating layer 12, and the solder resist layer 18 is on the circuit layer 16. In the embodiment, the insulating layer 12 has an opening 14 to expose the metal substrate 10, but it is not limited thereto. In other embodiments, the insulating layer 12 may have a plurality of openings 14 to expose the metal substrate 10. In the embodiment, at least one light-emitting device 28 is disposed in the opening 14 of the insulating layer 12. For example, FIG. 1D illustrates that two light-emitting devices 28 are disposed in the opening 14, but it is not limited thereto. In other embodiments, fewer or more light-emitting devices 28 may be disposed in one or more opening(s) 14. In an embodiment, the light-emitting devices 28 may be electrically connected to the circuit layer 16 on the insulating layer 12 by a wire bonding process. In one embodiment, the light-emitting devices 28 may include light-emitting diodes, but it is not limited thereto.

In the embodiment, an optical spacer 26 covers a sidewall of the opening 14 of the insulating layer 12. In one embodiment, the optical spacer 26 may be composed of a photosensitive material 20, e.g., a photoresist. For example, the optical spacer 26 may be composed of a dry film photoresist. Such an optical spacer 26 may be composed of a positive-type or negative-type photoresist and may be partially transparent or opaque. In the embodiment, the optical spacer 26 prevents the sidewall of the insulating layer 12 from yellowing due to illumination from the light-emitting devices 28. Therefore, the decay of the brightness of the light-emitting device package is mitigated and the reliability of the package is improved.

FIGS. 1A-1D are cross sectional views of manufacturing a light-emitting device package according to an embodiment of the invention. Referring to FIG. 1A, a metal substrate 10, e.g., a metal core print circuit board (MCPCB), is provided. In the embodiment, the metal substrate 10 includes any metals with high thermal conductivity, e.g., aluminum, copper, aluminum alloy or copper alloy, which improves the heat dissipation efficiency for the light-emitting device package. Then, an insulating layer 12 is formed on the metal substrate 10. Then, a circuit layer 16 is formed on the insulating layer 12, and a solder resist layer 18 is formed on the circuit layer 16. In one embodiment, the insulating layer 12 may include BT resin, ceramic, FR-4 glass fiber or a combination thereof. The circuit layer 16 may include copper, the solder resist layer 18 may include solder mask or any solder resist materials known in the art. Any methods known in the art may be used to manufacture the insulating layer 12, the circuit layer 16 and the solder resist layer 18, e.g., a fully additive process, semi additive process or subtractive process, and are not described in details herein. In the embodiment, the insulating layer 12 has an opening 14 to expose the metal substrate 10, but it is not limited thereto. In other embodiments, the insulating layer 12 may have a plurality of openings 14 to expose the metal substrate 10. The region of the metal substrate 10 exposed by the opening 14 is used to act as the die-bonding region for bonding the light-emitting devices 28 in the following process (see FIG. 1D).

FIGS. 1B-1D illustrate steps for covering the sidewall of the opening 14 with an optical spacer 26 according to an embodiment of the invention. Referring to FIG. 1B, the opening 14 is filled with a photosensitive material 20. For example, the photosensitive material may include photoresist, e.g., dry film photoresist. The photoresist may be positive-type or negative-type and may be partially transparent or opaque. In the embodiment, the top surface of the photosensitive material 20 is higher than or level with the top of the opening 14, such that the sidewall of the opening 14 are entirely covered by the photosensitive material 20.

Referring to FIG. 1C, a portion of the photosensitive material 20 is removed by a lithographic process 22 to form an optical spacer 26 (see FIG. 1D) on the sidewall of the opening 14. In the embodiment, steps of the lithographic process 22 include exposing a portion of the photosensitive material 20 in the opening 14 using a patterned photomask 24. Thereafter, a development process (not shown) is performed, such that the photosensitive material 20 that covers the sidewall of the opening 14 remains to form the optical spacer 26 (see FIG. 1D).

Referring to FIG. 1D, a plurality of light-emitting devices 28 are formed in the opening 14. For example, FIG. 1D illustrates that two light-emitting devices 28 are disposed in the opening 14, but it is not limited thereto. In other embodiments, fewer or more light-emitting devices 28 may be disposed in one or more opening(s) 14. In one embodiment, the light-emitting devices 28 may be electrically connected to the circuit layer 16 on the insulating layer 12 by a wire bonding process. In one embodiment, the light-emitting devices 28 may include light-emitting diodes, but it is not limited thereto. Thereafter, a phosphor encapsulation (not shown) is optionally formed on the light-emitting devices 28, and the manufacturing of the light device package is completed.

According to the manufacturing embodiment for the light device package, the optical spacer 26 prevents the sidewall of the insulating layer 12 from yellowing due to illumination from the light-emitting devices 28. Therefore, the decay of the brightness of the light-emitting device package is mitigated and the reliability of the package is improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting device package, comprising:
   a metal substrate;
   an insulating layer on the metal substrate, wherein the insulating layer has at least one opening to expose the metal substrate;
   at least one light-emitting device disposed in the at least one opening of the insulating layer; and
   an optical spacer covering a sidewall of the at least one opening of the insulating layer, wherein the optical spacer comprises a photoresist.

2. The package as claimed in claim 1, wherein the optical spacer comprises a dry film photoresist.

3. The package as claimed in claim 2, wherein the light-emitting device comprises a light-emitting diode.

4. The package as claimed in claim 2, wherein the metal substrate comprises aluminum, copper, aluminum alloy or copper alloy.

5. The package as claimed in claim 2, wherein the insulating layer comprises BT resin, ceramic, FR-4 glass fiber or a combination thereof.

6. The package as claimed in claim 2, wherein the optical spacer is partially transparent or opaque.

7. A method for manufacturing a light-emitting device package, comprising:
   providing a metal substrate;
   forming an insulating layer on the metal substrate, wherein the insulating layer has at least one opening to expose the metal substrate;
   covering a sidewall of the at least one opening of the insulating layer with an optical spacer, wherein the step of covering the sidewall of the at least one opening of the insulating layer comprises:
      filling the at least one opening of the insulating layer with a photoresist material; and
      removing a portion of the photoresist material by a lithographic process, such that the optical spacer composed of the photoresist material is formed on the sidewall of the at least one opening of the insulating layer; and
   forming at least one light-emitting device in the at least one opening of the insulating layer.

8. The method as claimed in claim 7, wherein the optical spacer comprises a dry film photoresist.

9. The method as claimed in claim 7, wherein the light-emitting device comprises a light-emitting diode.

10. The method as claimed in claim 7, wherein the metal substrate comprises aluminum, copper, aluminum alloy or copper alloy.

11. The method as claimed in claim 7, wherein the insulating layer comprises BT resin, ceramic, FR-4 glass fiber or a combination thereof.

12. The method as claimed in claim 7, wherein the optical spacer is partially transparent or opaque.

* * * * *